(12) United States Patent
Stralko

(10) Patent No.: US 8,219,045 B2
(45) Date of Patent: Jul. 10, 2012

(54) METHOD AND SYSTEM FOR CONTROLLING TRANSMITTER POWER USING VARIABLE FEEDBACK TRANSMITTER PARAMETERS

(75) Inventor: Mark W. Stralko, Villa Park, IL (US)

(73) Assignee: Motorola Soultions, Inc., Schaumburg, IL (US)

( * ) Notice: Subject to any disclaimer, the term of this patent is extended or adjusted under 35 U.S.C. 154(b) by 623 days.

(21) Appl. No.: 11/426,807

(22) Filed: Jun. 27, 2006

(65) Prior Publication Data

US 2007/0298735 A1    Dec. 27, 2007

(51) Int. Cl.
*H03C 1/62* (2006.01)
*H04B 17/00* (2006.01)

(52) U.S. Cl. .................. 455/115.1; 455/127.2; 455/129

(58) Field of Classification Search ............... 455/114.1, 455/114.2, 115.1–115.4, 125, 126, 129, 114.3, 455/127.1–127.5
See application file for complete search history.

(56) References Cited

U.S. PATENT DOCUMENTS

| | | | | |
|---|---|---|---|---|
| 4,122,400 | A * | 10/1978 | Medendorp et al. | ....... 330/207 P |
| 5,086,467 | A * | 2/1992 | Malek | ........................... 380/252 |
| 5,383,223 | A | 1/1995 | Inokuchi | |
| 6,108,527 | A | 8/2000 | Urban et al. | |
| 6,275,684 | B1 | 8/2001 | Kaneko et al. | |
| 6,362,690 | B1 * | 3/2002 | Tichauer | ........................ 330/298 |
| 6,417,732 | B1 * | 7/2002 | Radomski et al. | ......... 330/207 P |
| 6,480,559 | B1 * | 11/2002 | Dabak | ............................. 375/368 |
| 6,957,047 | B1 * | 10/2005 | Young et al. | ..................... 455/83 |
| 7,071,776 | B2 * | 7/2006 | Forrester et al. | ............... 330/129 |
| 2005/0208907 | A1 * | 9/2005 | Yamazaki et al. | ............. 455/126 |
| 2005/0227646 | A1 * | 10/2005 | Yamazaki et al. | ......... 455/127.3 |

OTHER PUBLICATIONS

PCT/US07/65422—PCT International Search Report mailed Aug. 27, 2008—6 pages.

* cited by examiner

*Primary Examiner* — Christian Hannon
(74) *Attorney, Agent, or Firm* — Barbara R. Doutre

(57) ABSTRACT

A system (100) and method (300) of feedback transmitter power control can include a transmitter temperature detector such as a thermistor based temperature detector (118), a detector for detecting forward and reflected transmitter power (113 and 115), and a voltage controlled attenuator (120) placed in a radio frequency power control feedback path for modifying transmitter power based on a detected transmitter temperature and a detected forward and reflected transmitter power. The system can further include a logarithmic amplifier controller (122) in the feedback path coupled to the voltage controlled attenuator as well as a power amplifier (112) coupled to the voltage controlled attenuator. The system can operate in both analog and time division multiple access modes. The system can be active in real time throughout a push-to-talk session.

29 Claims, 3 Drawing Sheets

METHOD AND SYSTEM FOR CONTROLLING TRANSMITTER POWER USING VARIABLE FEEDBACK TRANSMITTER PARAMETERS

FIELD

This invention relates generally to radio communication transmitters, and more particularly to a feedback power control scheme using detected thermal and VSWR load conditions.

BACKGROUND

Previous discrete type power control designs typically rectify an extracted radio frequency (RF) power signal which is applied (summed) to a difference amplifier input as an actual voltage value. The difference between set voltage and actual voltage is used by a difference amplifier to generate a control voltage applied to a power amplifier. In the case where a typical high dynamic range log detector/controller IC is used in a power control loop design, no practical access to the controller's difference amplifier inputs can be present as a means of implementing transmitter power cutback.

SUMMARY

Embodiments in accordance with the present invention provide a cutback circuit method which limits transmitter power amplifier dissipation under adverse thermal and voltage standing wave ratio (VSWR) load operating conditions.

In a first embodiment of the present invention, a method of feedback transmitter power control can include the steps of sensing transmitter temperature, sensing forward and reflected transmitter power, and modifying transmitter power using a voltage controlled attenuator in a feedback path based on sensed transmitter temperature and forward and reflected transmitter power. The method can operate in both analog and time division multiple access modes. The method can also be active in real time throughout a push-to-talk session. Transmitter temperature sensing can be done by using a thermistor based temperature detector and forward and reflected transmitter power sensing can be done by detecting VSWR using a diode based VSWR detector. The voltage controlled attenuator can be a pin diode based voltage controlled attenuator.

In a second embodiment of the present invention, a system of feedback transmitter power control can include a transmitter temperature detector such as a thermistor based temperature detector, a detector for detecting forward and reflected transmitter power such as a diode based VSWR detector, and a voltage controlled attenuator such as a pin diode based voltage controlled attenuator placed in a radio frequency power control feedback path for modifying transmitter power based on a detected transmitter temperature and a detected forward and reflected transmitter power. The system can further include a logarithmic amplifier controller in the feedback path coupled to the voltage controlled attenuator as well as a power amplifier coupled to the voltage controlled attenuator. As described above, the system can operate in both analog and time division multiple access modes. The system can be active in real time throughout a push-to-talk session.

In a third embodiment of the present invention, a transmitter can include a power amplifier, a transmitter temperature detector (such as a thermistor based temperature detector) coupled to the power amplifier, a detector for detecting forward and reflected transmitter power (such as a diode based VSWR detector), and a voltage controlled attenuator (such as a pin diode based voltage controlled attenuator) placed in a radio frequency power control feedback path for modifying transmitter power based on a detected transmitter temperature and a detected forward and reflected transmitter power. The transmitter can further include a logarithmic amplifier controller in the feedback path coupled to the voltage controlled attenuator.

Other embodiments, when configured in accordance with the inventive arrangements disclosed herein, can include a system for performing and a machine readable storage for causing a machine to perform the various processes and methods disclosed herein.

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "suppressing" can be defined as reducing or removing, either partially or completely.

The terms "program," "software application," and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

DETAILED DESCRIPTION OF THE DRAWINGS

Figure 1:
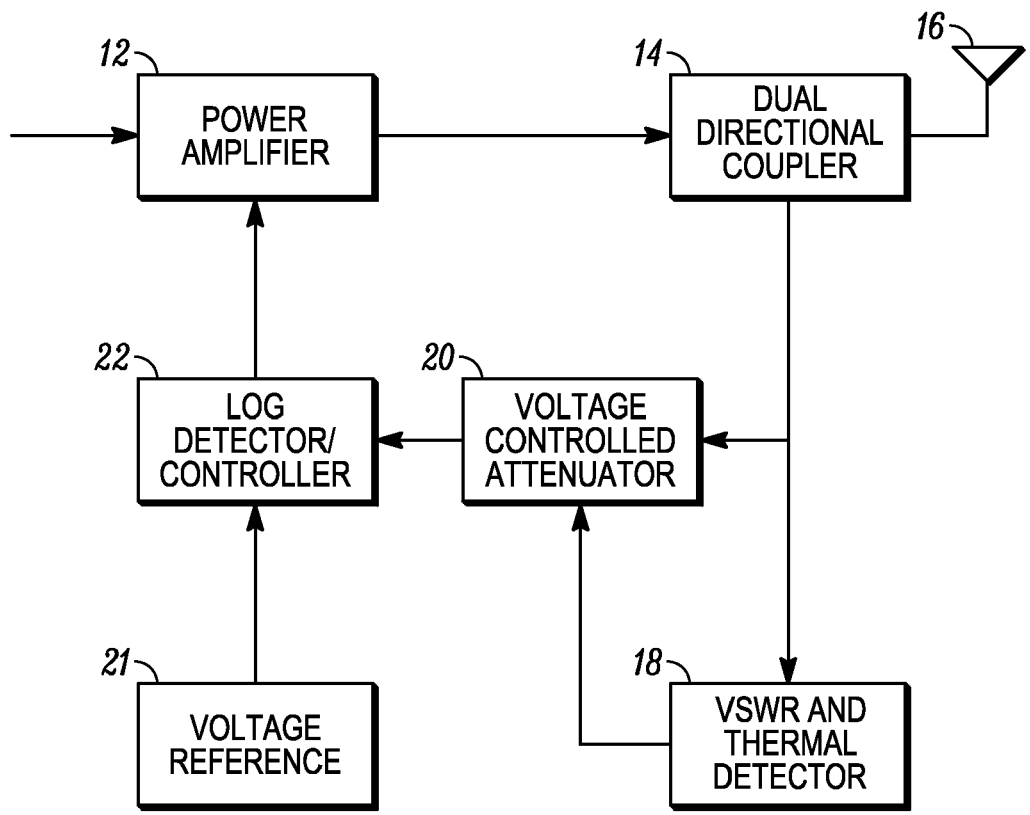
FIG. 1 is block diagram of a circuit using feedback power control in a transmitter circuit in accordance with an embodiment of the present invention.

While the specification concludes with claims defining the features of embodiments of the invention that are regarded as novel, it is believed that the invention will be better understood from a consideration of the following description in conjunction with the figures, in which like reference numerals are carried forward.

Embodiments in accordance with the invention include a cutback circuit and method which limits transmitter power amplifier dissipation under adverse thermal and VSWR load operating conditions. In this regard, an independent hardware solution is useful in applications where limited software capacity would prohibit a software type protection scheme. Thus, embodiments using a voltage controlled attenuator in a feedback path can provide a useful alternative for power control that can enable effective use of a high dynamic range log detector/controller IC having high set reference slope sensitivity on the order of 24 mV/db. Control of the feedback applied to the detector/controller IC as opposed to cutback control of its highly sensitive set reference provides a less sensitive, better controlled power cutback method.

Referring to FIG. 1, a circuit 10 in accordance with an embodiment of the present invention can include a power amplifier 12 coupled to a dual directional coupler 14. The dual directional coupler can be coupled to an antenna 16 as well as circuitry 18 providing VSWR and thermal sensing or detection. Circuitry 18 can include a thermistor based temperature detector and a diode based VSWR detector. The circuitry 18 can be coupled to and provide an input voltage to a voltage controlled attenuator 20. The voltage controlled attenuator 20 can be coupled to a logarithmic detector/controller 22 that couples to the power amplifier and completes the feedback loop. Note, a voltage reference 21 is provided to the controller 22.

Operationally, the Voltage Controlled RF Attenuator (VCA) 20 placed in an RF feedback loop will reduce transmitter power based on detected thermal and VSWR load conditions. Thermal and VSWR detector circuits 18 will generate VCA control voltage under adverse conditions which can proportionally drive the VCA 20 (to reduce attenuation and) to increase RF input signal at controller 22. This RF input signal increase to the controller 22 will cause the controller 22 to adjust its output voltage applied to a power amplifier input control (of the power amplifier 12) below its nominal value. As a result, transmitter output power will decrease thus protecting the power amplifier 12. RF input at the input of the controller 22 can be internally detected and compared relative to the constant external power set reference voltage 21 applied the controller 22.

Of note, the circuit 10 (or circuit 100 of FIG. 2) can sense transmitter temperature as well as forward and reflected transmitter power. It can use a Voltage Controlled Attenuator (VCA) placed in an RF power control feedback path that can reduce transmitter power based on detected thermal and VSWR load conditions. Additionally, such circuit(s) can operate or be active in both Analog or TDMA transmit modes. Furthermore, such circuitry can be active in real time throughout a push-to-talk duration or session.

Figure 2:
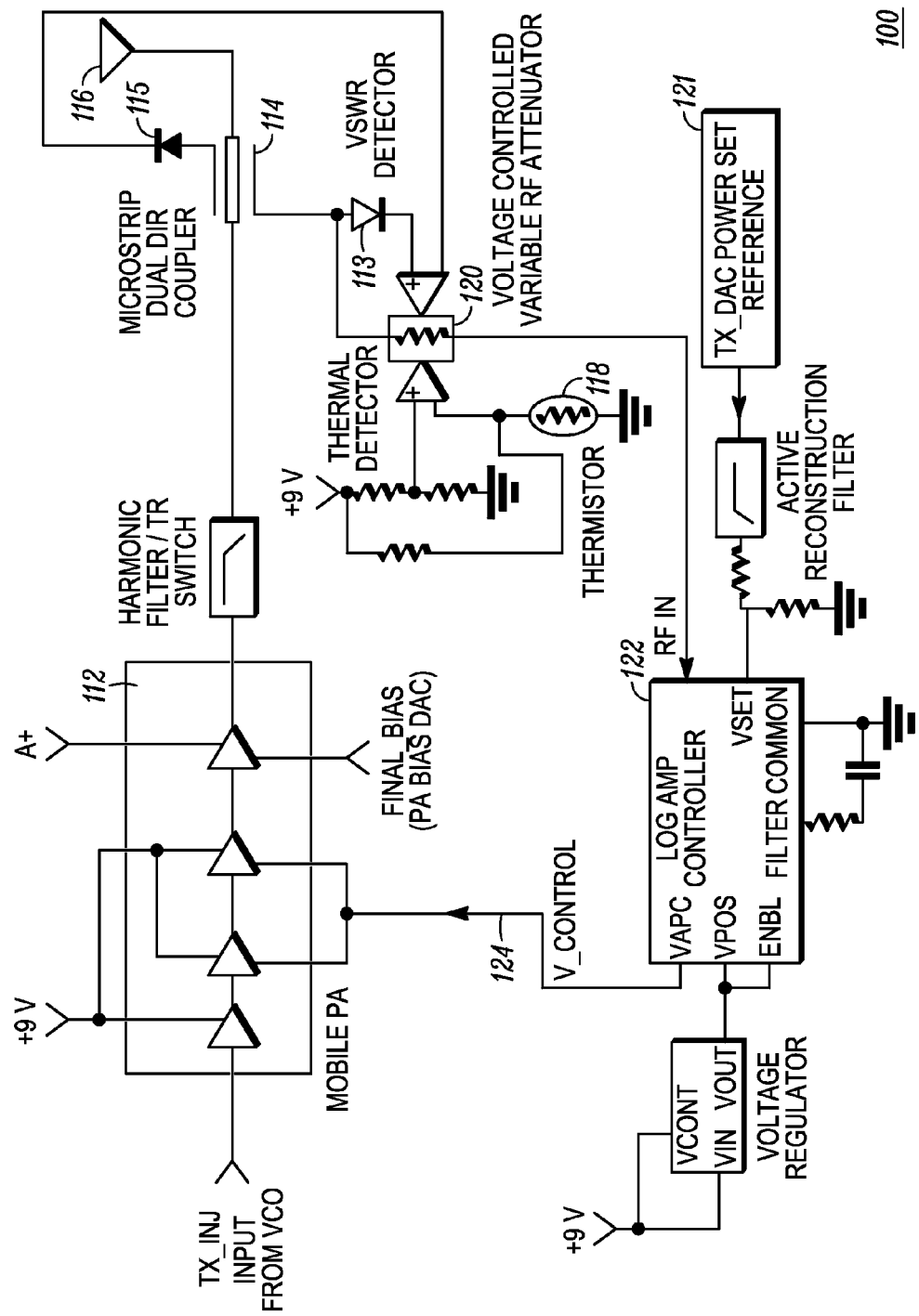
FIG. 2 is a more detailed block diagram of the circuit of FIG. 1 in accordance with an embodiment of the present invention.

Referring to FIG. 2, a more detailed circuit block diagram of a transmitter circuit 100 can include a power amplifier 112 coupled to a microstrip dual directional coupler 114 coupled to an antenna 116. The power amplifier 112 can be a multi-stage power amplifier using for example Laterally-diffused metal oxide semiconductor (LDMOS) technology although other semiconductor technologies can certainly be used. The dual directional coupler 114 can be coupled to VSWR and thermal detection circuits. In this instance, the VSWR detection circuitry can include a diode based detector 113 for forward transmitter power and another diode based detector 115 for reflected transmitter power. The thermal detection circuit can include a thermistor 118 such as a negative temperature coefficient (NTC) thermistor. As shown, the thermistor 118 and detectors 113 and 115 are coupled to respective operational amplifiers that provide voltage inputs to a voltage controlled variable attenuator (VCA) 120 such as a pin diode based VCA. The VCA 120 provides an RF input signal to a logarithmic amplifier controller 122 (such as a Logarithmic PA controller IC available from various manufacturers including Analog Devices among others) which in turn controls the power output of the power amplifier 112 using voltage control signal 124. The controller can also receive a constant external power set RF reference voltage 121. RF input at the input of the controller 122 can be internally detected and compared relative to the constant external power set reference voltage 121 applied the controller 122. More specifically, under adverse thermal or VSWR load conditions, the VSWR or thermal detection circuits raise a control voltage that lowers attenuation from the VCA 120 and initially causes additional RF input to the controller 122. As a result, the voltage control output 124 of the controller 122 decreases causing a corresponding decrease in the power of power amplifier 112.

Thus, in the arrangement described above, the transmitter power amplifier 112 power is controlled under extended operating load and thermal conditions using variable RF feedback control, external to the controller 122 such as a log type detector/controller IC. Instead of applying rectified extracted RF signals directly to the power controller's difference amplifier inputs (not shown, internal to controller 122), rectified extracted signals are applied to a difference amplifier coupled to the VCA 120 to produce a control voltage driving the VCA 120 in the RF coupled feedback path of the log type detector/controller IC.

Figure 3:
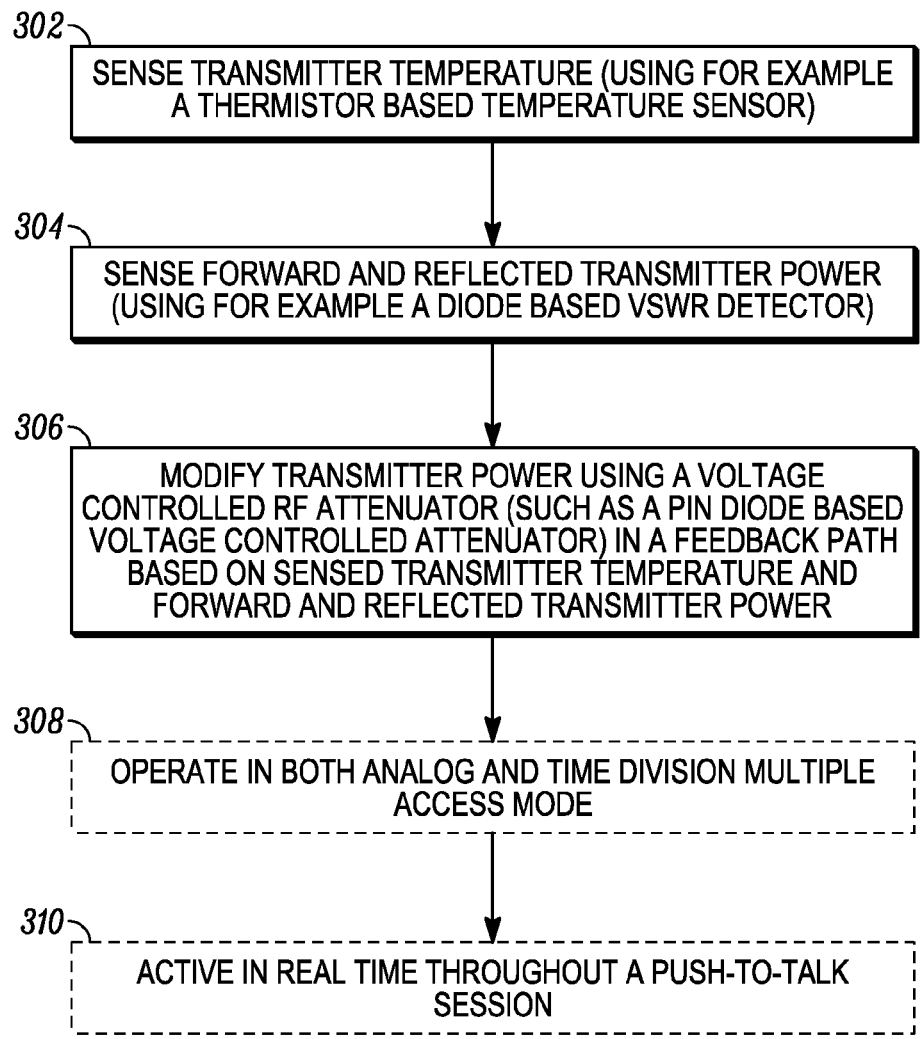
FIG. 3 is a flow chart illustrating a method of feedback transmitter power control in accordance with an embodiment of the present invention.

Referring to FIG. 3, a flow chart illustrating a method 300 of feedback transmitter power control can include the step 302 of sensing transmitter temperature, sensing forward and reflected transmitter power at step 304, and modifying transmitter power using a voltage controlled attenuator in a feedback path based on sensed transmitter temperature and forward and reflected transmitter power at step 306. The method 300 can alternatively operate in both analog or time division multiple access modes as shown at step 308. The method 300 can also optionally be active in real time throughout a push-to-talk session at step 310. Transmitter temperature sensing can be done by using a thermistor based temperature detector and forward and reflected transmitter power sensing can be done by detecting VSWR using a diode based VSWR detector. The voltage controlled attenuator can be a pin diode based voltage controlled attenuator.

In light of the foregoing description, it should be recognized that embodiments in accordance with the present invention can be realized in hardware, software, or a combination of hardware and software. A network or system according to the present invention can be realized in a centralized fashion in one computer system or processor, or in a distributed fashion where different elements are spread across several interconnected computer systems or processors (such as a microprocessor and a DSP). Any kind of computer system, or other apparatus adapted for carrying out the functions described herein, is suited. A typical combination of hardware and software could be a general purpose computer system with a computer program that, when being loaded and executed, controls the computer system such that it carries out the functions described herein.

In light of the foregoing description, it should also be recognized that embodiments in accordance with the present invention can be realized in numerous configurations contemplated to be within the scope and spirit of the claims. Additionally, the description above is intended by way of example only and is not intended to limit the present invention in any way, except as set forth in the following claims.

What is claimed is:

1. A method of feedback transmitter power control, comprising the steps of:
   sensing transmitter temperature;
   sensing forward and reflected transmitter power; and
   generating a control voltage using the transmitter temperature and the forward and reflected transmitter power;
   applying the control voltage, as a voltage controlled attenuator (VCA) control voltage, to a voltage controlled attenuator in a feedback path from a power amplifier to a controller IC;
   controlling an RF signal through the voltage controlled attenuator based on the VCA control voltage;

applying the controlled RF signal as an RF input to the controller IC in the feedback path;
generating a power amplifier (PA) voltage control signal by the controller IC based on the RF input; and
applying the PA voltage control signal to the power amplifier, wherein the PA voltage control signal modifies transmitter power of the power amplifier.

2. The method of claim 1, wherein the method operates in both analog and time division multiple access modes.

3. The method of claim 1, wherein the method is active in real time throughout a push-to-talk session.

4. The method of claim 1, wherein the step of sensing transmitter temperature is done by using a thermistor based temperature detector.

5. The method of claim 1, wherein the step of sensing forward and reflected transmitter power comprises detecting voltage standing wave ratio (VSWR) using a diode based VSWR detector.

6. The method of claim 1, wherein the voltage controlled attenuator is a pin diode based voltage controlled attenuator.

7. A system of feedback transmitter power control, comprising:
a transmitter temperature detector;
a detector for detecting forward and reflected transmitter power, wherein the transmitter temperature detector or the detector for detecting forward and reflected transmitter power generates a control voltage and applies the control voltage as a VCA control voltage to a voltage controlled attenuator thereby setting attenuation of the voltage controlled attenuator;
the voltage controlled attenuator placed in a radio frequency power control feedback path between a power amplifier and a logarithmic amplifier controller, the voltage controlled attenuator receiving the VCA control voltage and controlling an RF signal based on the VCA control voltage and applying the controlled RF signal as an RF input to the logarithmic amplifier controller in the feedback path; and
the logarithmic amplifier controller generating a PA voltage control signal based on the RF input and applying the PA voltage control signal to the power amplifier, wherein the PA voltage control signal modifies transmitter power of the power amplifier.

8. The system of claim 7, wherein the logarithmic amplifier controller is in the feedback path.

9. The system of claim 8, wherein the power amplifier in the feedback path is coupled to the logarithmic amplifier controller.

10. The system of claim 7, wherein the system operates in both analog and time division multiple access modes.

11. The system of claim 7, wherein the system is active in real time throughout a push-to-talk session.

12. The system of claim 7, wherein the transmitter temperature detector is a thermistor based temperature detector.

13. The system of claim 7, wherein the detector for detecting forward and reflected transmitter power comprises a diode based voltage standing wave ratio (VSWR) detector.

14. The system of claim 7, wherein the voltage controlled attenuator is a pin diode based voltage controlled attenuator.

15. The system for claim 7, wherein the control voltage is proportional to the variations in the transmitter temperature or the variations in the forward and reflected transmitter power.

16. The system for claim 15, wherein the RF input signal to the logarithmic amplifier controller is based on the attenuation of the voltage controlled attenuator.

17. The system for claim 16, wherein the voltage control output signal to the power amplifier is based on the RF input signal.

18. A transmitter, comprising:
a power amplifier (PA) for transmitting an RF signal;
a transmitter temperature detector coupled to the power amplifier;
a detector for detecting forward and reflected transmitter power, wherein the transmitter temperature detector or the detector for detecting forward and reflected transmitter power generates a control voltage and applies the control voltage as a VCA control voltage to a voltage controlled attenuator thereby setting attenuation of the voltage controlled attenuator; and
the voltage controlled attenuator placed in a radio frequency power control feedback path between the PA and a logarithmic amplifier controller, the voltage controlled attenuator controlling the RF signal based on the VCA control voltage and applying the controlled RF signal as an RF input to the logarithmic amplifier controller in the feedback path; and
the logarithmic amplifier controller coupled to the voltage controlled attenuator for generating a PA voltage control signal based on the RF input and applying the PA voltage control signal to the power amplifier, wherein the PA voltage control signal modifies transmitter power of the power amplifier.

19. The transmitter of claim 18, wherein the logarithmic amplifier controller is in the feedback path.

20. The transmitter of claim 18, wherein the transmitter temperature detector is a thermistor based temperature detector and the detector for detecting forward and reflected transmitter power comprises a diode based voltage standing wave ratio (VSWR) detector.

21. The transmitter of claim 18, wherein the voltage controlled attenuator is a pin diode based voltage controlled attenuator.

22. The transmitter of claim 18, wherein the transmitter operates in both analog and time division multiple access modes.

23. The transmitter of claim 18, wherein the transmitter is active in real time throughout a push-to-talk session.

24. A method of feedback transmitter power control, comprising the steps of:
sensing transmitter temperature at a thermal detector;
sensing forward and reflected transmitter power at a VSWR detector; and
generating first and second control voltages from the thermal and VSWR detectors respectively using the sensed transmitter temperature and the sensed forward and reflected transmitter power;
applying the first and second control voltages to a voltage controlled variable attenuator to control a variable RF input, the variable RF input varying in response to changes in the first and second control voltages resulting from changes in the sensed transmitter temperature and changes in the sensed forward and reflected transmitter power;
applying the variable RF input to a controller IC;
generating an adjustable power amplifier (PA) voltage control signal output by the controller IC in response to the variable RF input; and
applying the adjustable PA voltage control signal to a power amplifier, wherein the adjustable PA voltage control signal modifies transmitter power of the power amplifier.

25. A method of claim 24, further comprising:
internally detecting the variable RF input at the controller IC;
comparing the internally detected variable RF input relative to a constant external power set reference voltage applied to the controller IC; and
wherein under adverse thermal or VSWR conditions, the VSWR or thermal detectors raise the first or second control voltage that lowers attenuation from the voltage controlled variable attenuator to initially cause additional RF input to the controller IC, thereby causing the PA voltage control signal output from the controller IC to decrease causing a corresponding decrease in the transmitter power of the power amplifier.

26. A system of feedback transmitter power control, comprising:
a power amplifier for transmitting an RF signal;
a transmitter temperature detector;
a VSWR detector for detecting forward and reflected transmitter power, wherein the transmitter temperature detector or the detector for detecting forward and reflected transmitter power generates a control voltage and applies the control voltage to a voltage controlled variable RF attenuator thereby setting attenuation of the voltage controlled variable RF attenuator;
the voltage controlled variable RF attenuator placed in a radio frequency power control feedback path for controlling the RF signal in response to changes in the control voltage resulting from changes in the transmitter temperature or changes in the forward and reflected transmitter power to provide a variable RF input,
a logarithmic amplifier controller coupled to the voltage controlled variable RF attenuator in the feedback path for receiving the controlled RF signal as an RF input from the voltage controlled variable RF attenuator,
the logarithmic amplifier controller generating a PA voltage control signal, the PA voltage control signal varying in response to changes in the variable RF input,
a power amplifier receiving the PA voltage control signal, wherein the PA voltage control signal modifies transmitter power of the power amplifier in response to changes in the variable RF input.

27. The system of claim 26, further comprising:
a constant external power set reference voltage applied to the logarithmic amplifier controller;
the variable RF input being internally detected by the input logarithmic amplifier controller and compared relative to the constant external power set reference voltage; and
wherein under adverse thermal or VSWR load conditions, the VSWR or transmitted temperature detector circuits raise the control voltage that lowers attenuation from the voltage controlled variable RF attenuator to initially cause additional RF input to the logarithmic amplifier controller; resulting in the voltage control output of the logarithmic amplifier controller to decrease causing a corresponding decrease in the transmitter power of the power amplifier.

28. A transmitter, comprising:
a power amplifier;
a transmitter temperature detector coupled to the power amplifier;
a VSWR detector for detecting forward and reflected transmitter power, wherein the transmitter temperature detector and the VSWR detector generates temperature and VSWR control voltages;
a voltage controlled variable RF attenuator receiving the temperature and VSWR control voltages and setting attenuation of the voltage controlled variable RF attenuator in response thereto;
the voltage controlled variable RF attenuator for generating a variable RF signal in the feedback path based on changes in the temperature and VSWR control voltages;
a logarithmic amplifier controller receiving the variable RF signal and generating a voltage control signal, the voltage control signal being applied to the power amplifier, wherein the voltage control signal modifies transmitter power of the power amplifier in response to variations in the variable RF signal in the feedback path.

29. The transmitter of claim 28, further comprising:
a constant external power set reference voltage applied to the logarithmic amplifier controller;
the variable RF input being internally detected by the input logarithmic amplifier controller and compared relative to the constant external power set reference voltage; and
wherein under adverse thermal or VSWR conditions, the VSWR or transmitter temperature detectors raise their respective control voltages to lower attenuation from the voltage controlled variable RF attenuator thereby providing additional RF input to the logarithmic amplifier controller which results in the voltage control output of the logarithmic amplifier controller to decrease causing a corresponding decrease in the transmitter power of the power amplifier.

* * * * *

UNITED STATES PATENT AND TRADEMARK OFFICE
CERTIFICATE OF CORRECTION

| | |
|---|---|
| PATENT NO. | : 8,219,045 B2 |
| APPLICATION NO. | : 11/426807 |
| DATED | : July 10, 2012 |
| INVENTOR(S) | : Stralko |

Page 1 of 1

It is certified that error appears in the above-identified patent and that said Letters Patent is hereby corrected as shown below:

On the Title Page Item (73), under "Assignee", Line 1, delete "Soultions," and insert -- Solutions, --, therefor.

Signed and Sealed this
Eighth Day of January, 2013

David J. Kappos
*Director of the United States Patent and Trademark Office*